United States Patent
Gunn, III et al.

(10) Patent No.: US 7,262,117 B1
(45) Date of Patent: Aug. 28, 2007

(54) GERMANIUM INTEGRATED CMOS WAFER AND METHOD FOR MANUFACTURING THE SAME

(75) Inventors: Lawrence C. Gunn, III, Encinitas, CA (US); Giovanni Capellini, Rome (IT); Gianlorenzo Masini, Carlsbad, CA (US)

(73) Assignee: Luxtera, Inc., Carlsbad, CA (US)

( * ) Notice: Subject to any disclaimer, the term of this patent is extended or adjusted under 35 U.S.C. 154(b) by 346 days.

(21) Appl. No.: 11/064,035

(22) Filed: Feb. 22, 2005

Related U.S. Application Data

(63) Continuation-in-part of application No. 10/458,165, filed on Jun. 10, 2003, now Pat. No. 6,887,773.

(60) Provisional application No. 60/645,808, filed on Jan. 21, 2005.

(51) Int. Cl.
  *H01L 21/20* (2006.01)
(52) U.S. Cl. ............... 438/481; 438/508; 257/E21.103

(58) Field of Classification Search ............... 438/481, 438/505, 508, 933, 958; 257/E21.103
See application file for complete search history.

(56) References Cited

U.S. PATENT DOCUMENTS 4,614,564 A * 9/1986 Sheldon et al. ............. 438/492
6,537,894 B2 * 3/2003 Skotnicki et al. ........... 438/424

* cited by examiner

*Primary Examiner*—Chandra Chaudhari
(74) *Attorney, Agent, or Firm*—Fernandez & Associates, LLP

(57) ABSTRACT

The present invention discloses an integration flow of germanium into a conventional CMOS process, with improvements in performing selective area growth, and implementing electrical contacts to the germanium, in a way that has minimal impact on the preexisting transistor devices. The present invention also provides methods to integrate the germanium without impacting the optical or electrical performance of these devices, except where intended, such as in a germanium photodetector, or germanium waveguide photodetector.

37 Claims, 16 Drawing Sheets

GERMANIUM INTEGRATED CMOS WAFER AND METHOD FOR MANUFACTURING THE SAME

This application is a continuation-in-part of application Ser. No. 10/458,165, filed on Jun. 10, 2003, now U.S. Pat. No. 6,887,773, and claims the benefit of U.S. Provisional Application Ser. No. 60/645,808, filed on Jan. 21, 2005, entitled "Provisional disclosure on a process for integration of germanium into a CMOS fabrication process," which are incorporated herein by their entirety.

BACKGROUND INFORMATION

1. Field of the Invention

The invention relates generally to the field of chip manufacturing process, and more particularly to a process for integrating germanium into a CMOS fabrication process.

2. Description of Related Art

The convergence of silicon and optical fabrication processes presents an attractive manufacturing solution by leveraging the use of a standard CMOS (complementary metal-oxide semiconductor) manufacturing process. Integration of germanium (Ge) in a CMOS process has been desired for a number of reasons. Firstly, Ge has a smaller bandgap and higher mobility than silicon. Secondly, Ge may be used as a growth template for III-IV compound semiconductors, such as GaAs. Thirdly, Ge may be used as a growth template for strained silicon materials.

Some optical companies have selected III-V semiconductors to provide high detection efficiency, but this selection poses difficult challenges in incorporating a III-V material in a standard CMOS technology. Challenges related to how to integrate germanium into CMOS may exist around how to contact the germanium and how to selectively grow the germanium in desired locations. For additional background information on Ge on Si structures, the reader is referred to "Metal-semiconductor-metal near-infrared light detector based on epitaxial Ge/Si", by L. Colace et al. and G. Capellini et al., Applied Physics Letters, Vol. 72, No. 24, pp. 3175-3177.

Accordingly, there is a need for a method to integrate germanium into CMOS wafers in an efficient manner.

SUMMARY OF THE INVENTION

In one aspect of the invention, a method for incorporating germanium in a standard CMOS flow includes steps of: providing a CMOS wafer having a stack of layers including silicon layer, salicide blocking layer and a contact punch through layer deposited over a substrate; depositing a field growth mask layer over the contact punch through layer; etching the salicide blocking layer, contact punch through layer and he field growth mask layer to generate a germanium window, wherein a bottom of the germanium window exposes the silicon layer; growing a germanium layer in the germanium window; depositing a capping layer over the CMOS wafer; and patterning the field growth mask layer.

Advantageously, with the insertion of germanium layer, the present invention provides the capability of converting an optical signal carried at a wavelength range that can be absorbed by the germanium into an electrical signal.

These and other features, aspects and advantages of the present invention will become better understood with reference to the following drawings, description and claims.

DETAILED DESCRIPTION OF PREFERRED EMBODIMENTS

The present invention discloses an integration flow of germanium into a conventional CMOS process, with improvements in performing selective area growth, and implementing electrical contacts to the germanium, in a way that has minimal impact on the preexisting transistor devices. The present invention also provides methods to integrate the germanium without impacting the optical or electrical performance of these devices, except where intended, such as in a germanium photodetector, or germanium waveguide photodetector.

Figure 1:
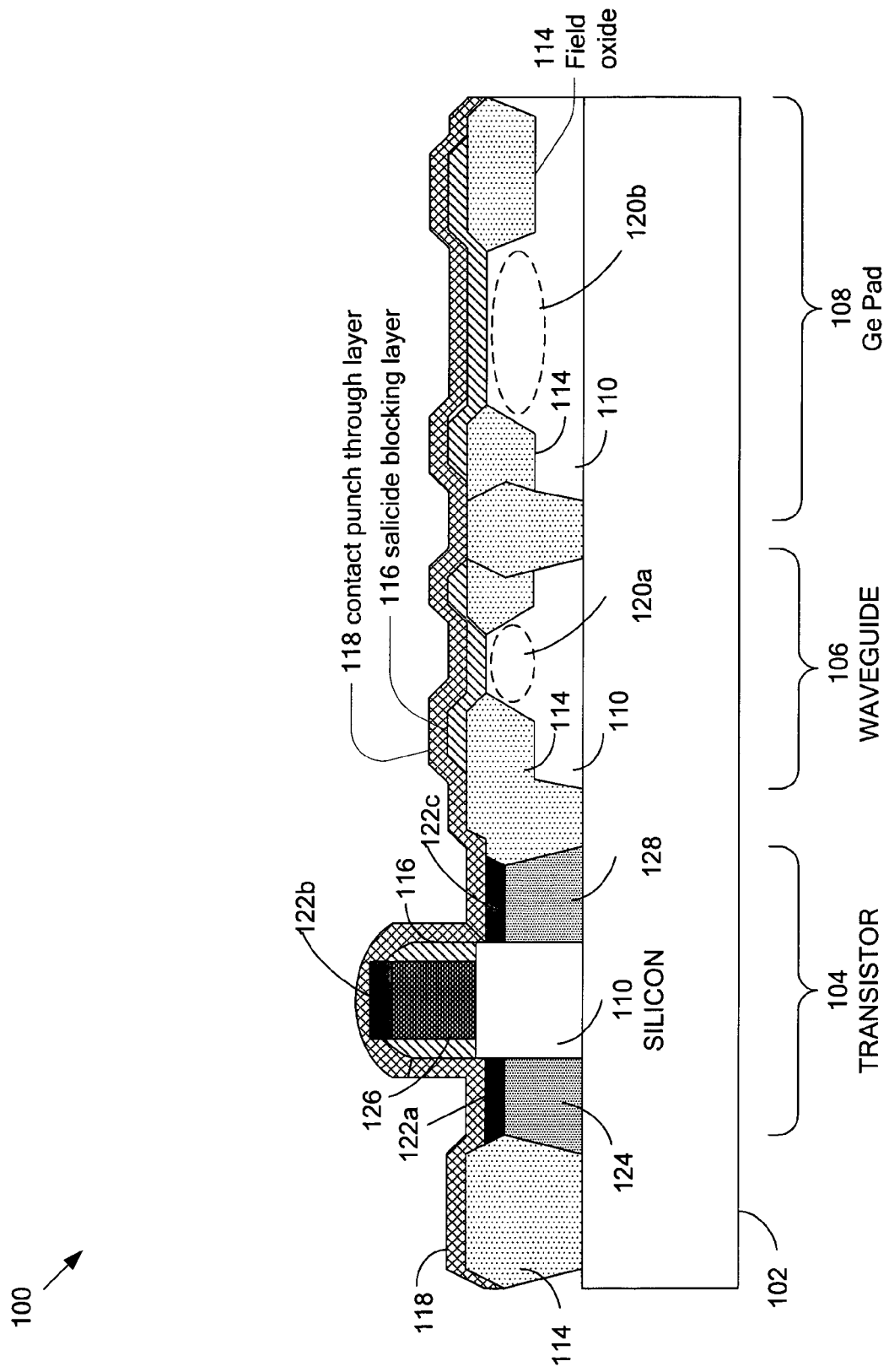
FIG. 1 is a schematic cross sectional diagram of an exemplary embodiment of a CMOS wafer containing a silicon waveguide and a pad for deposition of Ge in accordance with one embodiment of the present teachings.

FIG. 1 is a schematic cross sectional diagram of an exemplary embodiment 100 of CMOS wafer, illustrating its layer structure at insertion point into the CMOS process in accordance with one embodiment of the present teachings. The embodiment 100 includes a substrate 102, preferably made of silicon, and three portions over the substrate 102; transistor 104, waveguide 106 and Ge pad 108. At this point in the process, the Ge pad references the location at which Ge will be deposited in the following steps. As illustrated in FIG. 1, the wafer 100 may also include silicon layer 110; field oxide (layer) 114; salicide blocking layer 116; contact punch through layer 118; salicide layers 122a-c over source 124, gate 126 and drain 128, respectively.

At this point, implants into the silicon 110 may have been accomplished for the transistor 104, and for the optical devices if desired. The ohmic contact regions to the silicon 110 may have been formed, typically using salicide in regions not protected by the salicide blocking layer 116, and a layer of dielectric (or, equivalently contact punch-thru layer) 118 has been deposited over the entire wafer 100. In one embodiment, contact punch-thru layer 118 may have two or more layers. For example, a buffer layer may be required for proper adhesion and stress management, before another layer is deposited that has different properties. In another embodiment, the contact punch-thru layer 118 may be graded in composition. For convenience, hereinafter, the terms layer and film may be used interchangeably.

The purpose of the contact punch-thru layer 118 may be to provide a uniform film thickness for use during the contact module, as described in connection with FIG. 9. Since the depth of an etch down to the top of the gate contact 122b and down to a source contact 122a or drain contact 122c may be different, the contact punch-thru layer 118 may provide a hardmask at the bottom of the interlevel dielectric layer 802 (FIG. 9). After all contact holes have been etched down to the hardmask, an etch of the hardmask may occur. Since the hardmask may be the same thickness everywhere, this etch may bottom out on the contact regions 122a-c nearly simultaneously, regardless of the depth of the hole through the interlevel dielectric 802 (shown in FIG. 8).

One problem with this hardmask may be that it may not be conducive to selective area growth of germanium. For example, if this hardmask contains sufficient nucleation sites for Ge growth, or the seed of the germanium growth, then germanium will grow over the entire wafer, instead of being confined to the desired regions. Another problem with this hardmask may be that it remains in place over the majority of the wafer. Since it is reasonable to expect some inadvertent growth of germanium on any film that is used as a mask, it is desirable to have a sacrificial film covering the wafer, which will be removed after germanium growth, and prior to continuation of standard transistor processing. Finally, it may not be desirable to modify any properties of this hardmask due to the optimized nature of the existing silicon contact processing. Thus, modifications in film thickness or composition are not recommended in regions containing transistors. It's therefore desirable to completely remove all films necessary for Ge integration from the remainder of the wafer. In FIG. 1, and all subsequent figures, the dashed circles 120a-b are representative of where light could be guided using the various embodiments of the wafer structure.

FIG. 1 shows a SOI (silicon-on-insulator) process, where two different depths of silicon etches are shown. In this case, one etch may go down to the buried oxide (or, equivalently field oxide layer) 114, and the second etch may stop part way through the silicon 110. However, this process will work in other processes without modification. Three examples are a bulk silicon process, which does not contain a buried oxide layer, a fully isolated SOI process, which contains an etch entirely through the silicon film, and a partially isolated SOI process, which contains an etch partially through the silicon film. Other potential substrates include more than one buried oxide layer, and potentially SiGe alloys. The key point is that this technique will work largely independently from the nature of the substrate 102.

Note that one skilled in the art of CMOS fabrication would recognize that a number of additional films and implants have been left out in FIG. 1, but they have been left out for simplicity and to allow us to focus on the innovation that the present document covers. As mentioned, FIG. 1 shows the insertion point in the CMOS process, and from this point forward there are two closely related processing options that will be covered in connection with FIGS. 2-7 and 10-14, respectively.

Figure 2:
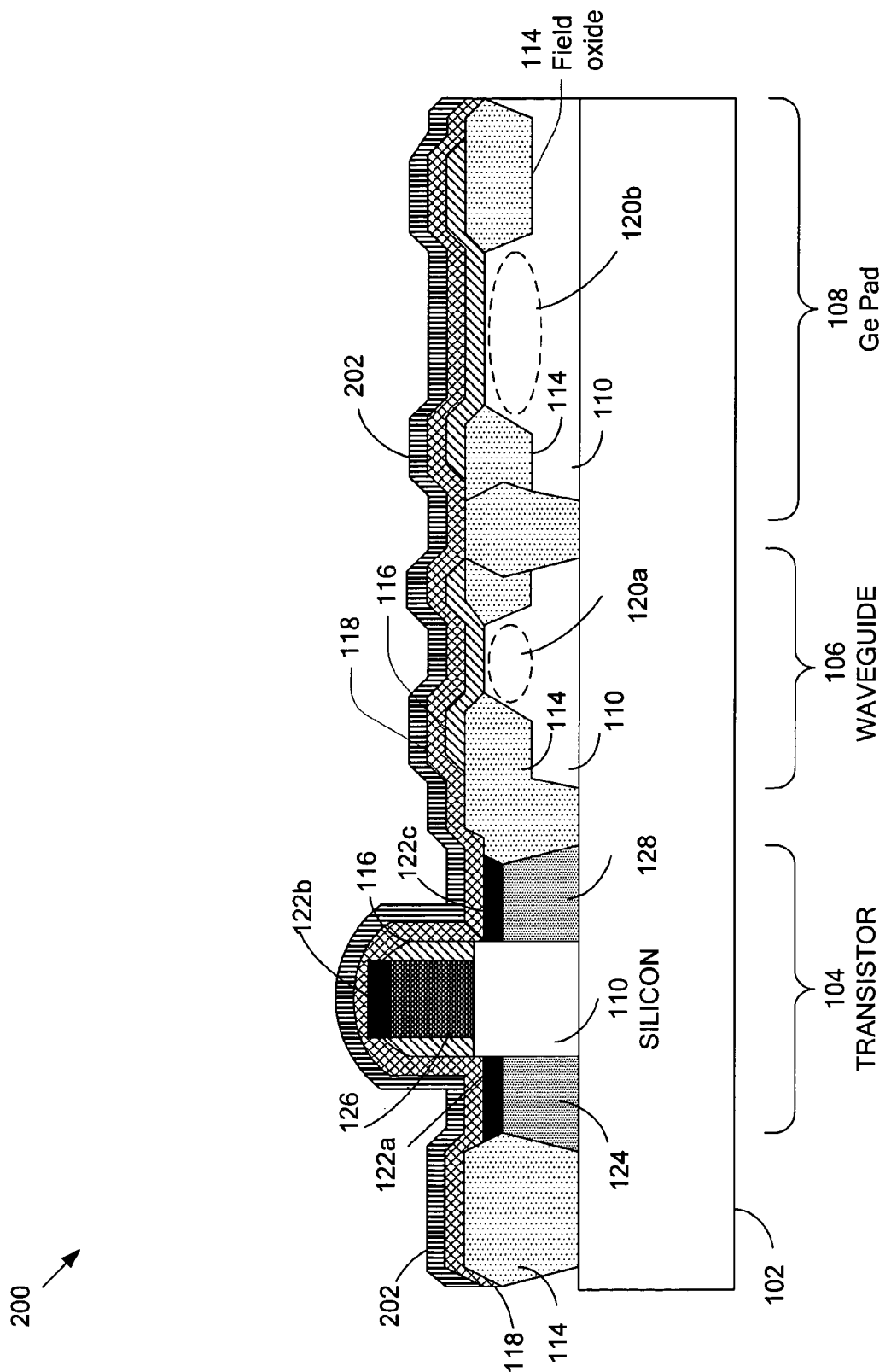
FIG. 2 is a schematic cross sectional diagram of a CMOS wafer fabricated by depositing a field growth mask layer over the CMOS wafer in FIG. 1 in accordance with one embodiment of the present teachings.

FIG. 2 shows a cross sectional view of a CMOS wafer 200 fabricated by depositing a film 202 on the CMOS wafer 100 in accordance with one embodiment of the present teachings. The regions where growth is not intended will be referred to as the "field." The film 202, referred to as field growth mask layer (or, equivalently, field masking layer), is shown as conformal, although another option would be to deposit and planarize this film using standard techniques known to one in the art.

The properties of the field growth mask layer 202, preferably made of silicon dioxide, should be chosen carefully. The field growth mask layer 202 should provide a good selectivity to epitaxial germanium growth (shown in FIG. 4) on the silicon 110. This is conventionally accomplished through reduction in nucleation sites in the field growth mask layer 202. One way to accomplish this may be to optimize the stochiometry of the field growth mask layer 202. For example, if the field growth mask layer 202 is made of silicon oxide, or silicon nitride, there should be perfect reaction of the silicon with oxygen or nitrogen, so that there are no dangling silicon bonds available on the surface of the field growth mask layer 202. A variety of techniques are known to those skilled in the art of film deposition, such as annealing in reactive gasses, that assist in the alleviation of dangling bonds, and it is envisioned that such techniques will be employed.

A second property that the field growth mask layer 202 must have is that it must be able to be etched selectively with respect to the contact punch through layer 118 underneath. It's important that during removal of the field growth mask layer 202, the thickness of the contact punch through layer 118 may be as unperturbed as possible.

Finally, the field growth mask layer 202 should be able to be deposited with a thermal budget that will not significantly impact the implant profiles and film conductivities, as well as other properties of the existing transistor 104.

The field growth mask layer 202 may consist of more than one layer, depending on the nature of the exact integration. For example, there might exist a need for a buffer layer of one composition, and a film surface of a second composition, in order to achieve both good adhesion, and a good masking effect. Intermediate films or a graded film might be required between the bottom of the film and the top of the film.

Figure 3:
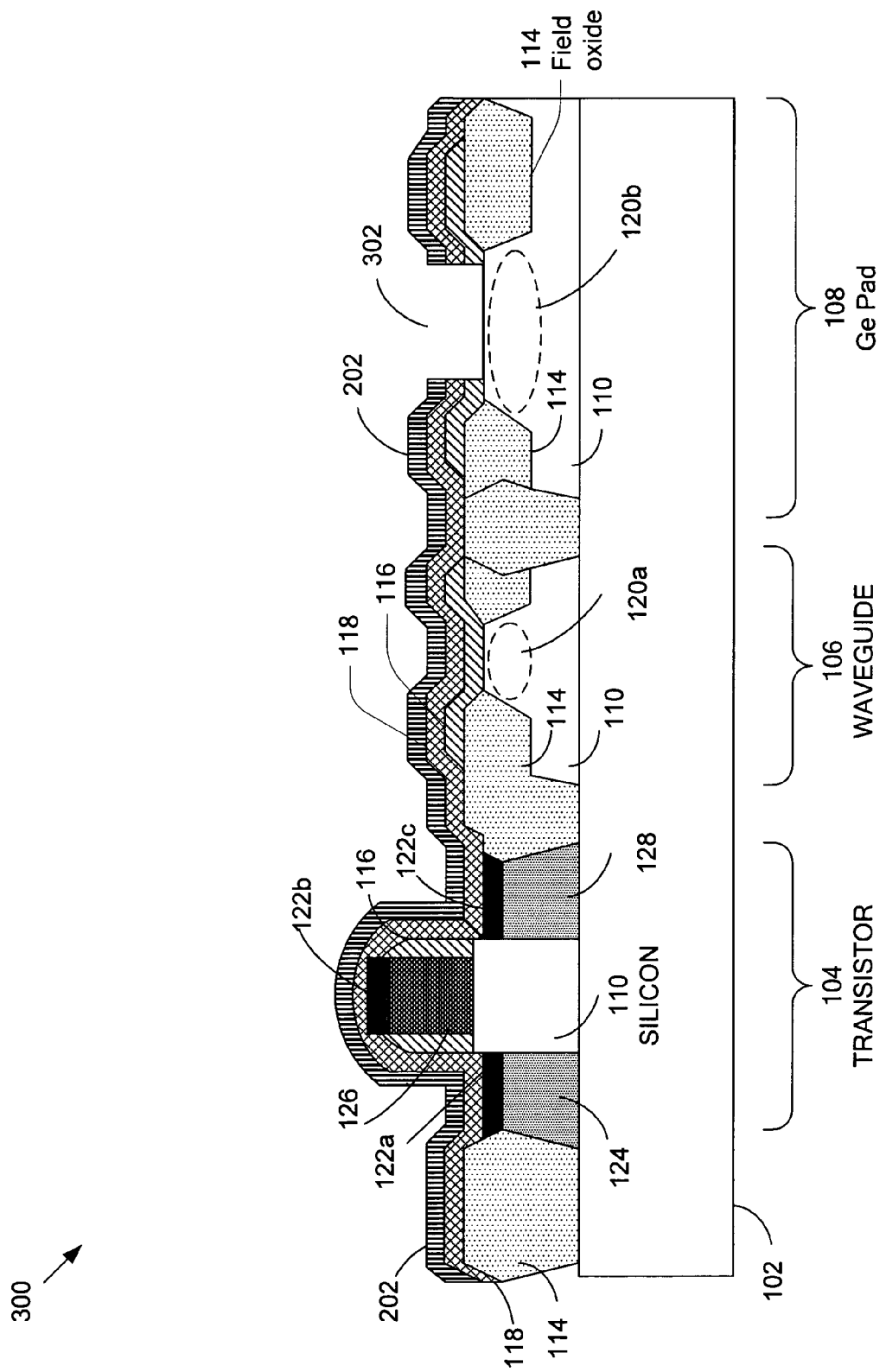
FIG. 3 is a schematic cross sectional diagram of a CMOS wafer fabricated by etching three layers of the CMOS wafer in FIG. 2 in accordance with one embodiment of the present teachings.

FIG. 3 shows a schematic cross sectional view of a CMOS wafer 300 including film stack etched down to the surface of silicon 110 in accordance with one embodiment of the present teachings. As illustrated in FIG. 3, the CMOS wafer 300 may be fabricated by etching the field growth mask layer 202, contact punch through layer 118, and the salicide blocking layer 116 of the CMOS wafer 200 in FIG. 2. As discussed in connection with FIG. 4, the window 302 formed by etching process may become an opening where germanium may be grown. Etching techniques for these films 116, 118 and 202 are common knowledge to one skilled in the art of CMOS processing. Additionally, at this point in the process, there is an opportunity to perform additional implants in the silicon 110, and to perform cleaning of the silicon 110 as required for the following growth of germanium.

Figure 4:
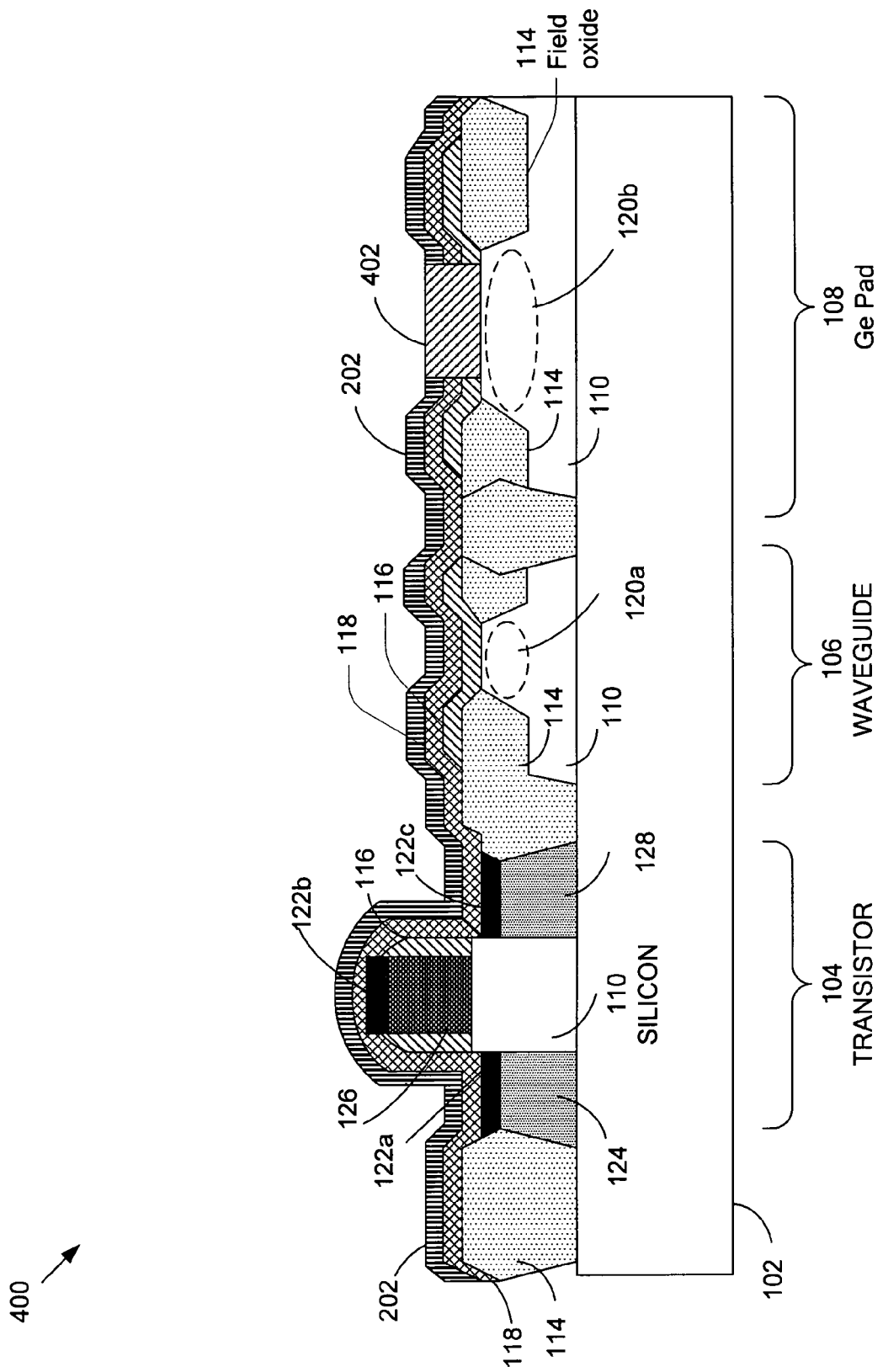
FIG. 4 is a schematic cross sectional diagram of a CMOS wafer fabricated by growing germanium over the CMOS wafer in FIG. 3 in accordance with one embodiment of the present teachings.

FIG. 4 shows a schematic cross sectional diagram of a CMOS wafer 400 fabricated by selectively growing germanium on the CMOS wafer 300 in FIG. 3 in accordance with one embodiment of the present teachings. The growth of germanium (layer) 402 on the silicon surface 110 is covered in U.S. patent application Ser. Nos. 10/458,165 and 10/600,563 which are incorporated herein by reference. It is noted that germanium may inadvertently grow on the field growth mask layer 202. While it is intended that the field growth mask layer 202 suppress this type of growth, it's still likely that some amount of inadvertent growth may occur.

Additionally, while the surface of the germanium 402 is shown as flat and level with the top of the opening, this need not be the case. The germanium surface can be left substantially lower than the surrounding field growth mask layer 202, or it can be grown somewhat thicker than the surrounding field growth mask layer 202. Also, the surface morphology can include non-planar features, such as a mound, or a germanium pad with raised edges, a Ge pad with a wavy surface, or a germanium pad made from a cluster of germanium islands. It is noted that any degree of crystallinity might be employed depending on the application.

It is well known that germanium of varying degrees of crystallinity is often desired, ranging from amorphous to polycrystalline, to highly crystalline. The Ge layer in the present disclosure refers generally to any of these varying degree of crystallinity, and one skilled in the art will understand how to vary growth conditions to target the desired germanium. For example, highly crystalline material with few defects is desired for a waveguide photodetector.

In one embodiment, the thickness of germanium 402 may be preferably 200 nm thick. In another embodiment, the thickness of germanium 402 may preferably equal to the sum of the thickness of the salicide blocking layer 116 and contact punch through layer 118.

Figure 5:
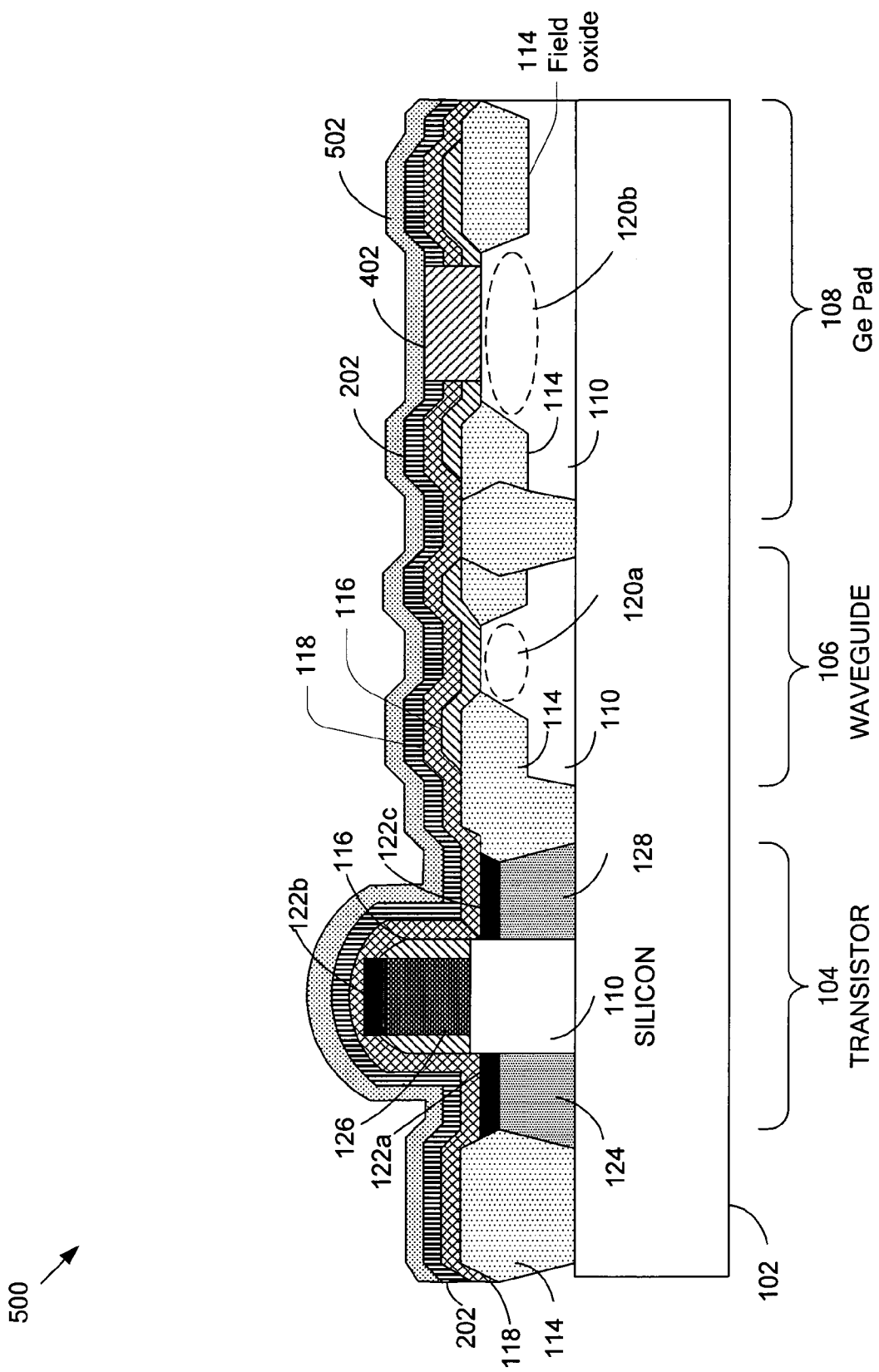
FIG. 5 is a schematic cross sectional diagram of a CMOS wafer fabricated by depositing a capping layer over the CMOS wafer in FIG. 4 in accordance with one embodiment of the present teachings.

FIG. 5 is a schematic cross sectional diagram of a CMOS wafer 500 fabricated by depositing a (germanium) capping layer 502 on top of the CMOS wafer 400 in FIG. 4 in accordance with one embodiment of the present teachings. The capping layer 502, preferably made of silicon rich silicon nitride, is shown as conformal, but could be planarized. One particularly advantageous way to construct the capping layer may be to use a film composition and thickness identical to the contact punch through layer 118. This would allow the punch through etch on the silicon 110 and germanium 402 to bottom out simultaneously. For manufacturability reasons, to ensure good contact across a large wafer, there is often some degree of overetch designed into this punch through etch. Since this might penetrate through the germanium 402 at a different rate than the salicide 122a-c or silicon 110, it's potentially desirable to target capping layer thickness that slightly offset from the contact punch through layer 118, to better control the depth of contact penetration into the germanium 402. This could be critical if the germanium contact 902d-e (shown in FIG. 9) intends to hit an implanted germanium region that's fairly shallow.

Additionally, at the point shown in FIG. 5, it's possible to perform implants of the germanium that would penetrate through the germanium capping layer 502.

Figure 6:
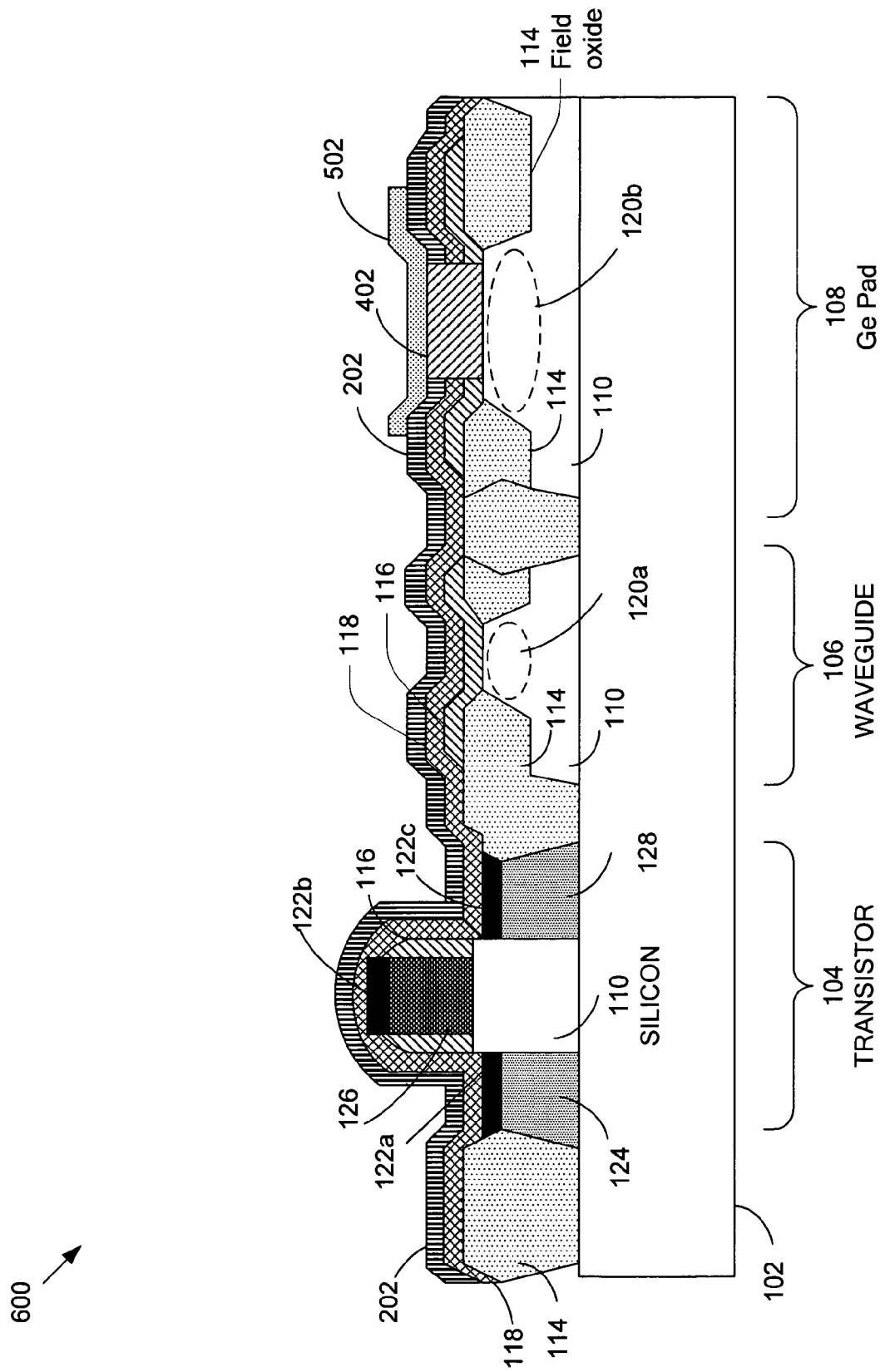
FIG. 6 is a schematic cross sectional diagram of a CMOS wafer fabricated by patterning and removing the capping layer of the CMOS wafer in FIG. 5 in accordance with one embodiment of the present teachings.
Figure 7:
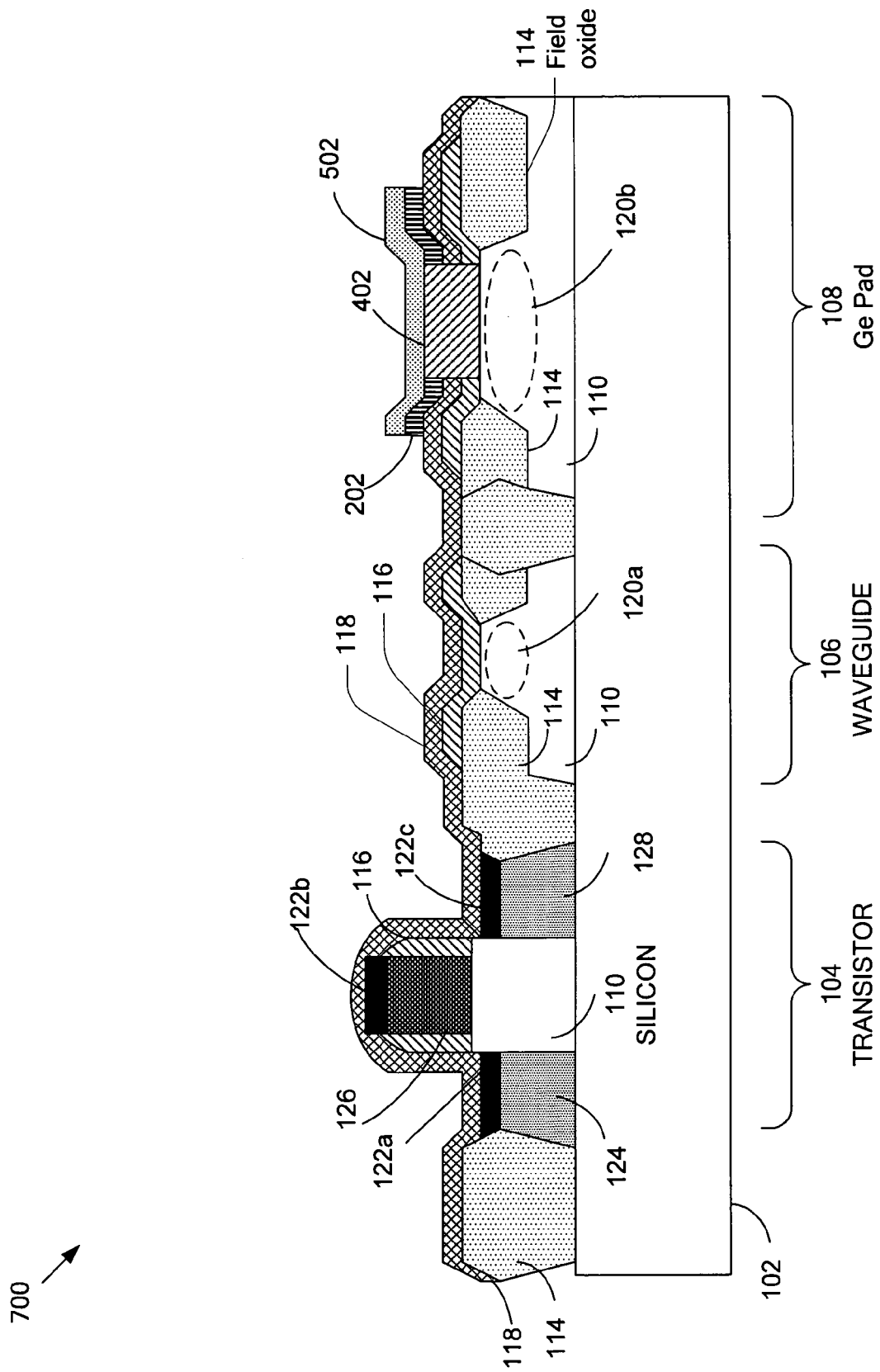
FIG. 7 is a schematic cross sectional diagram of a CMOS wafer fabricated by patterning and removing the capping and field growth mask layers of the CMOS wafer in FIG. 5 in accordance with one embodiment of the present teachings.

FIG. 6 shows a schematic cross sectional diagram of a CMOS wafer 600 fabricated by patterning and removing the capping layer 502 in accordance with one embodiment of the present teachings. Patterning techniques are well known to those skilled in the art, such as lithography, wet etching, dry etching, etc., and will not be discussed here. In FIG. 6, this etch is shown to stop on the field growth mask layer 202. In an alternative embodiment, the field growth mask layer 202 could be removed at the same time, or in a separate step, resulting a CMOS wafer 700 shown in FIG. 7. FIG. 7 is a schematic cross sectional diagram of a CMOS wafer 700 generated by patterning and removing the capping layer 502 and field growth mask layer 202 in accordance with one embodiment of the present teachings.

As mentioned previously, a highly selective etch stop between the field growth mask layer 202 and the contact punch through layer 118 is desired to ensure that the thickness of the contact punch through layer 118 is not modified. If there is some degree of etching of the contact punch through layer 118 required, then the original thickness of the contact punch through film 118 can be increased, so that this etching returns the contact punch through layer 118 to the desired thickness.

Additionally, this is a good point in the process to ensure that the inadvertent germanium growth in the field regions is removed from the substrate, either through use of the field growth mask film 202 as a sacrificial film, or through selective etch chemistry, or some combination of the two. A wide variety of precise options for these activities are well known to those skilled in the art, and will not be elaborated here.

Figure 8:
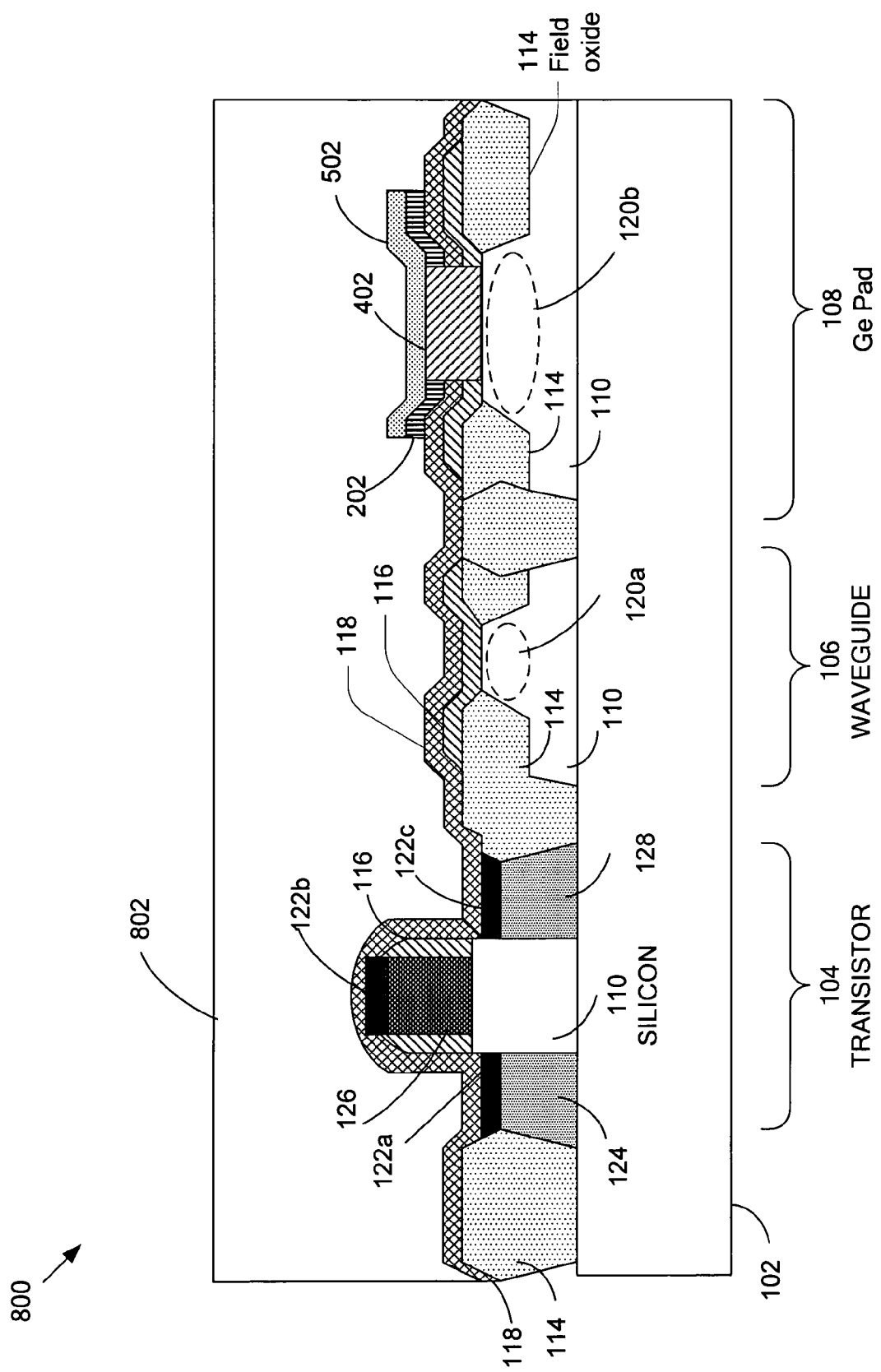
FIG. 8 is a schematic cross sectional diagram of a CMOS wafer fabricated by depositing a dielectric layer over the CMOS wafer in FIG. 7 in accordance with one embodiment of the present teachings.
Figure 9:
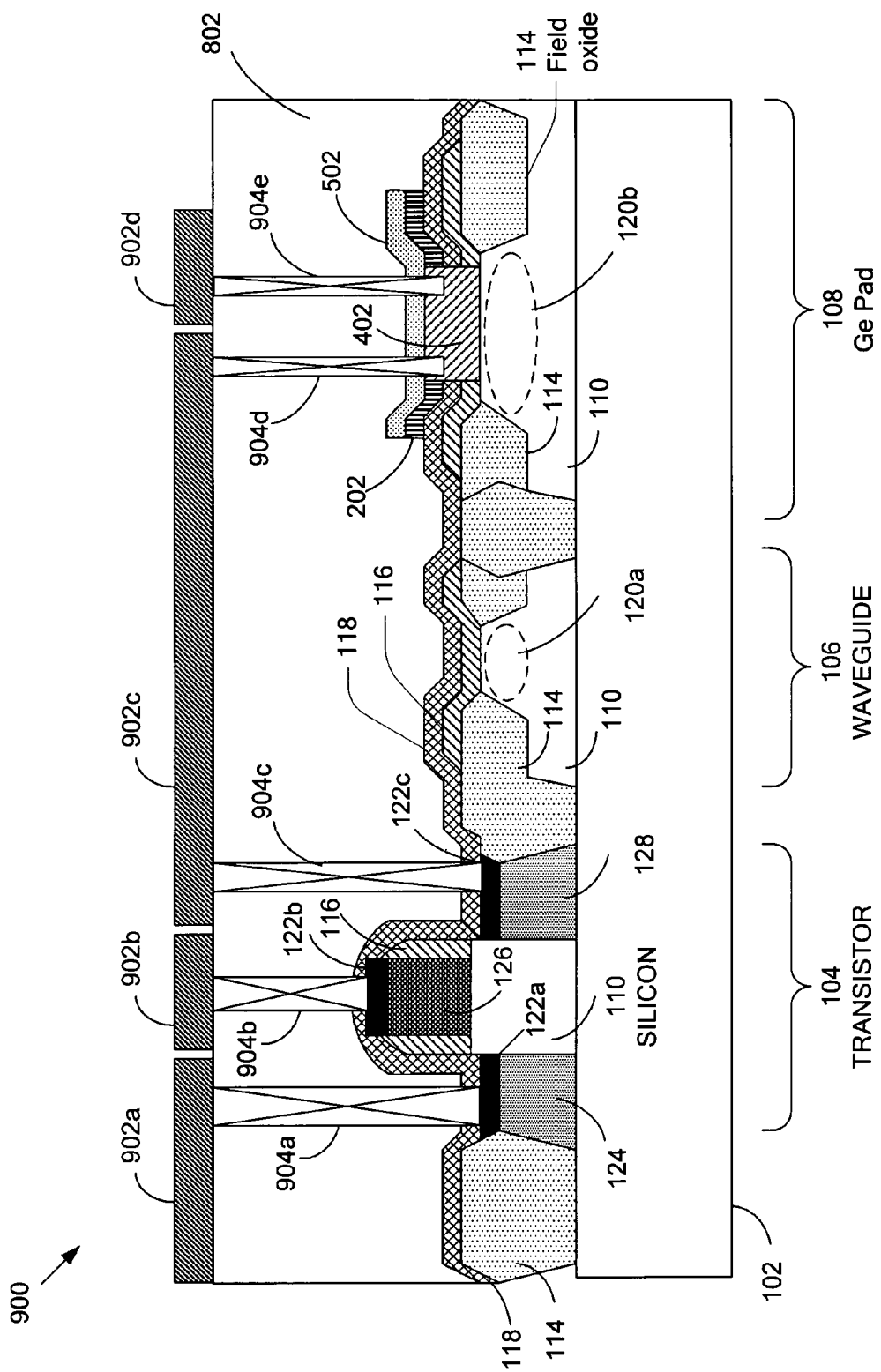
FIG. 9 is a schematic cross sectional diagram of a CMOS wafer fabricated by etching and depositing contacts and a routing metal layer on the CMOS wafer in FIG. 8 in accordance with one embodiment of the present teachings.

FIG. 8 is a schematic cross sectional diagram of a CMOS wafer 800 fabricated by depositing a dielectric layer over the CMOS wafer 700 in FIG. 7 in accordance with one embodiment of the present teachings. The dielectric layer 802 may be intended to contain the contacts 904a-e (shown in FIG. 9), and to separate the first layer of metal routing 902a-d (shown in FIG. 9) from the active device regions.

FIG. 9 is a schematic cross sectional diagram of a CMOS wafer 900 fabricated by etching and depositing contacts and a routing metal layer on the CMOS wafer 800 in FIG. 8 in accordance with one embodiment of the present teachings. To deposit contacts (or equivalently contact metallization) 904a-e, the dielectric layer 802 may be etched first. Then, the contacts 904a-e and the routing metal layer 902a-d may be deposited by conventional depositing techniques, where the contacts 904a-c may connect the source 124, gate 126, and the drain 128 to routing metal layer 902a, 902b and 902c, respectively. Two contacts 902d-e may be used to connect the routing metal layer 902c-d to the germanium 402. Note that FIG. 9 shows contacts to both germanium 402, silicon transistor source 124 and drain 128, and transistor gate 126. However, this does not represent the entire set of possible contacts to the silicon, as there exist other electronic and photonic devices that are contacted in a similar manner as the transistor, but serve other functionality than as a gate or source/drain electrode. For example, it may be desired to contact the silicon pad 110 underneath the germanium 402 in one or more locations, which may also be implanted with one or more species, and which may or may not contain an ohmic contact. It is noted that FIG. 9 shows only one routing metal layer 902 even though it should be apparent to those of ordinary skill that any number of CMOS process steps may be further performed on the CMOS wafer 900 without deviating from the present teachings.

Figure 10:
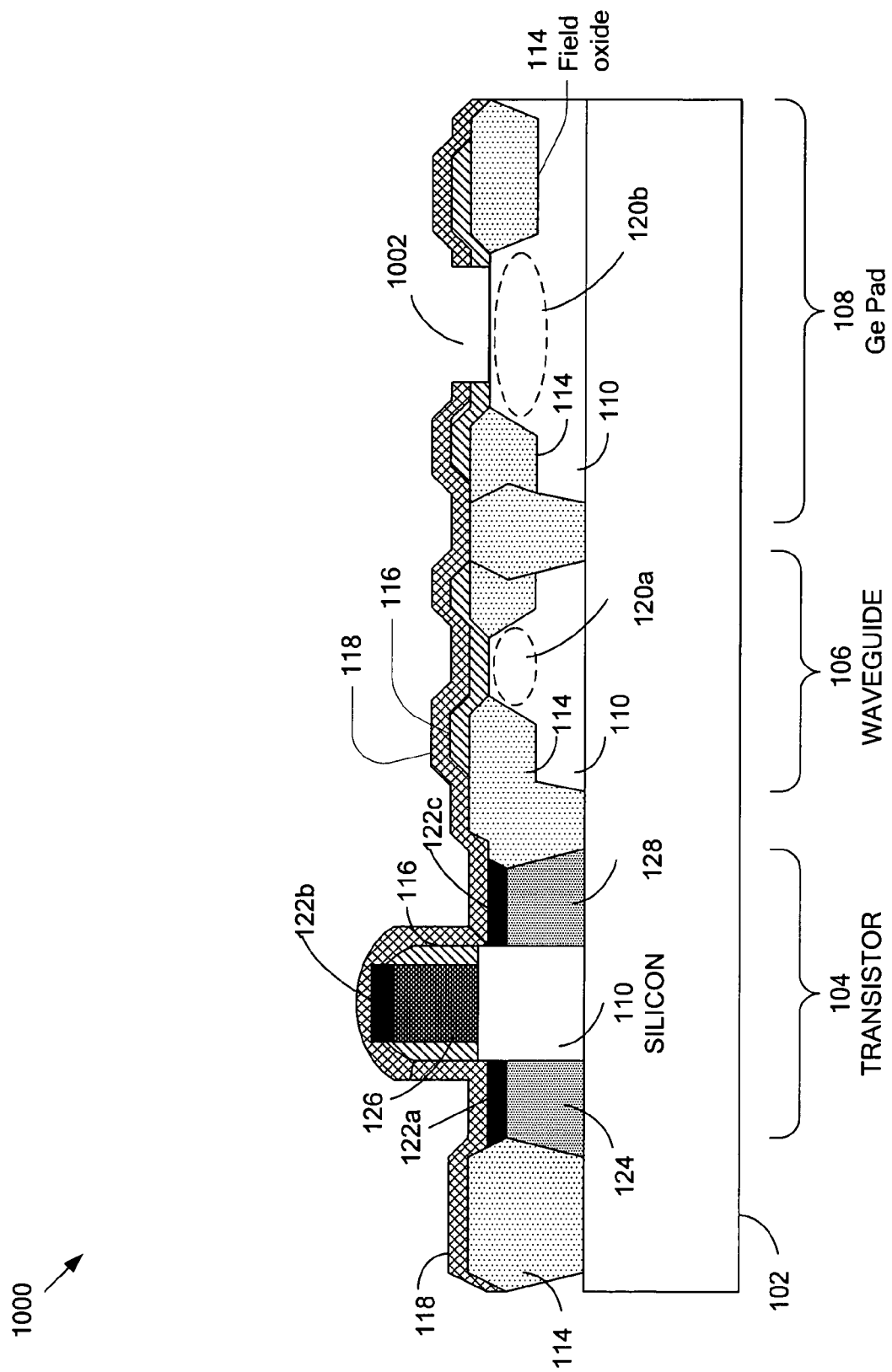
FIG. 10 is a schematic cross sectional diagram of a CMOS wafer fabricated by etching contact punch through and salicide blocking layers of the CMOS wafer in FIG. 1 in accordance with one embodiment of the present teachings.
Figure 11:
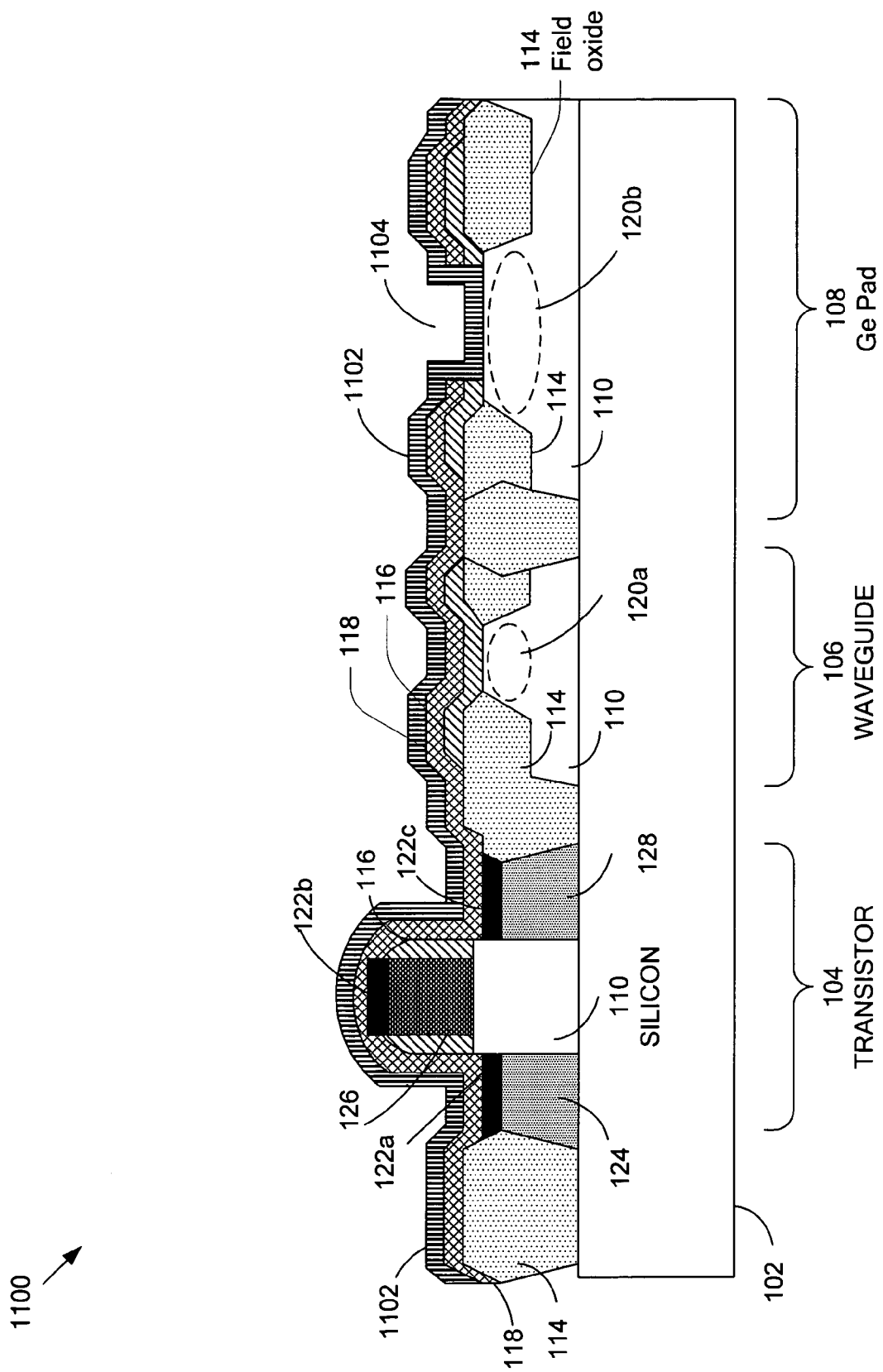
FIG. 11 is a schematic cross sectional diagram of a CMOS wafer fabricated by depositing a field growth mask layer over the CMOS wafer in FIG. 10 in accordance with one embodiment of the present teachings.

One potential problem with the process steps illustrated in FIGS. 2-7 may be that the ability for the sidewall of the contact punch through film 118 to provide a nucleation site for unwanted germanium growth, which could impact the quality of the final Ge pad 108. As shown in FIG. 3, the etching process may expose a sidewall of the contact punch through film 118. During the following deposition of germanium 402, this sidewall portion of the contact punch through film 118 forming a boundary of the window 302 may become a nucleation site for unwanted germanium growth. One processing option to prevent this from occurring is to ensure that the sidewalls of the germanium window 302 are passivated with the same material as the field growth mask layer 202. This optional process is shown in FIGS. 10 through 15. For convenience, the process described by FIGS. 2-7 is referred to as a first process, the process described by FIGS. 10-14 is referred to as a second process FIG. 10 is a schematic cross sectional diagram of a CMOS wafer 1000 fabricated by etching the contact punch through layer 118 and salicide blocking layer 116 of the CMOS wafer 100 in FIG. 1 in accordance with one embodiment of the present teachings. As illustrated in FIG. 10, a germanium window 1002 is opened, in this case, prior to the deposition of field growth mask layer, which is subsequently deposited as shown in FIG. 11.

FIG. 11 is a schematic cross sectional diagram of a CMOS wafer 1100 fabricated by depositing a field growth mask layer 1102 over the CMOS wafer 1000 in FIG. 10 in accordance with one embodiment of the present teachings. As shown in FIG. 11, the side and bottom of the window 1104 is covered by the field growth mask layer 1102. In one embodiment, the field growth mask layer 1102 may be a thin conformal coating, which is easily achieved with CVD deposition techniques. In an alternative embodiment, a thicker film that more completely fills the germanium window 1104 could also be employed.

Figure 12:
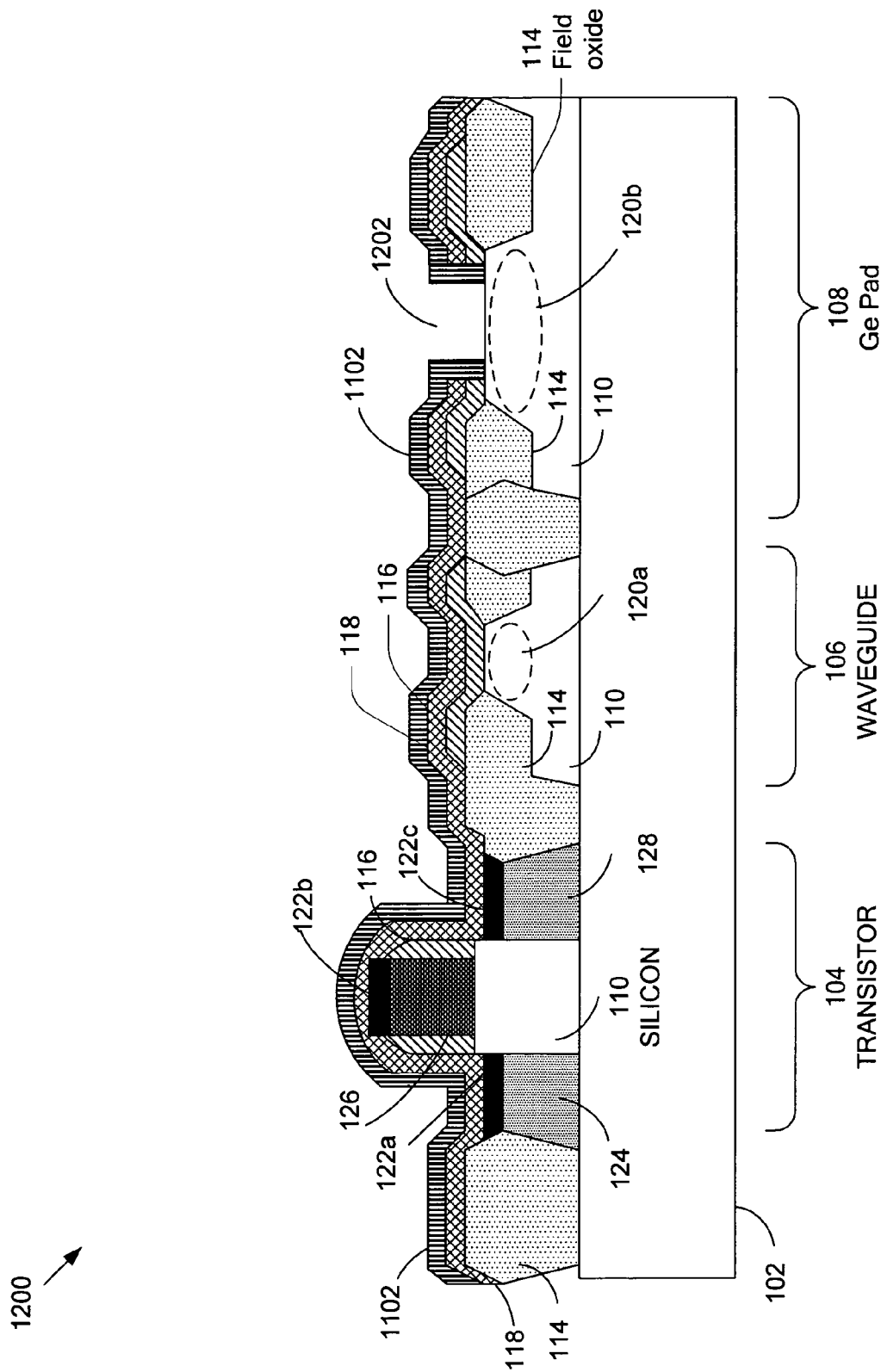
FIG. 12 is a schematic cross sectional diagram of a CMOS wafer fabricated by patterning the field growth mask layer of the CMOS wafer in FIG. 11 in accordance with one embodiment of the present teachings.

FIG. 12 is a schematic cross sectional diagram of a CMOS wafer 1200 fabricated by patterning the field growth mask layer 1102 of the CMOS wafer in FIG. 11 in accordance with one embodiment of the present teachings. As illustrated in FIG. 12, only the bottom portion of the field growth mask layer 1102 at the window 1104 has been removed, exposing silicon 110 at the window 1202. Note that this may require an additional mask step than the first process. Additionally, there are design rules that will require some reduction in size of the opening of the field growth mask layer 1102 compared to the germanium window 1202. While it is shown that the edges of the Ge window align with the edges of the conformal film that extends up the sidewalls of the opening, it is possible that there is some standoff between the surface of the sidewall film and the edge of the opening 1202.

Figure 13:
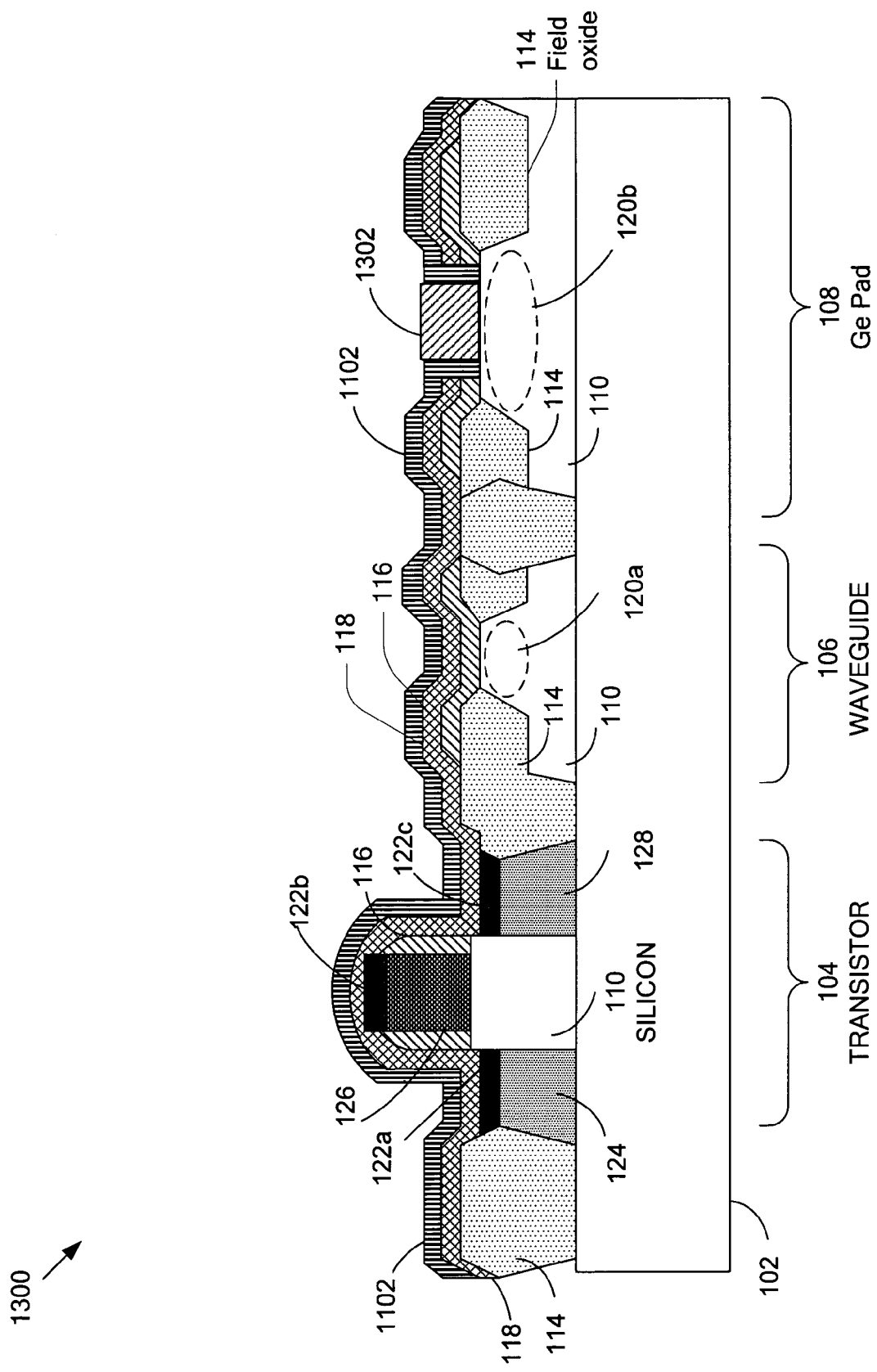
FIG. 13 is a schematic cross sectional diagram of a CMOS wafer fabricated by growing a germanium layer over the CMOS wafer in FIG. 12 in accordance with one embodiment of the present teachings.
Figure 14:
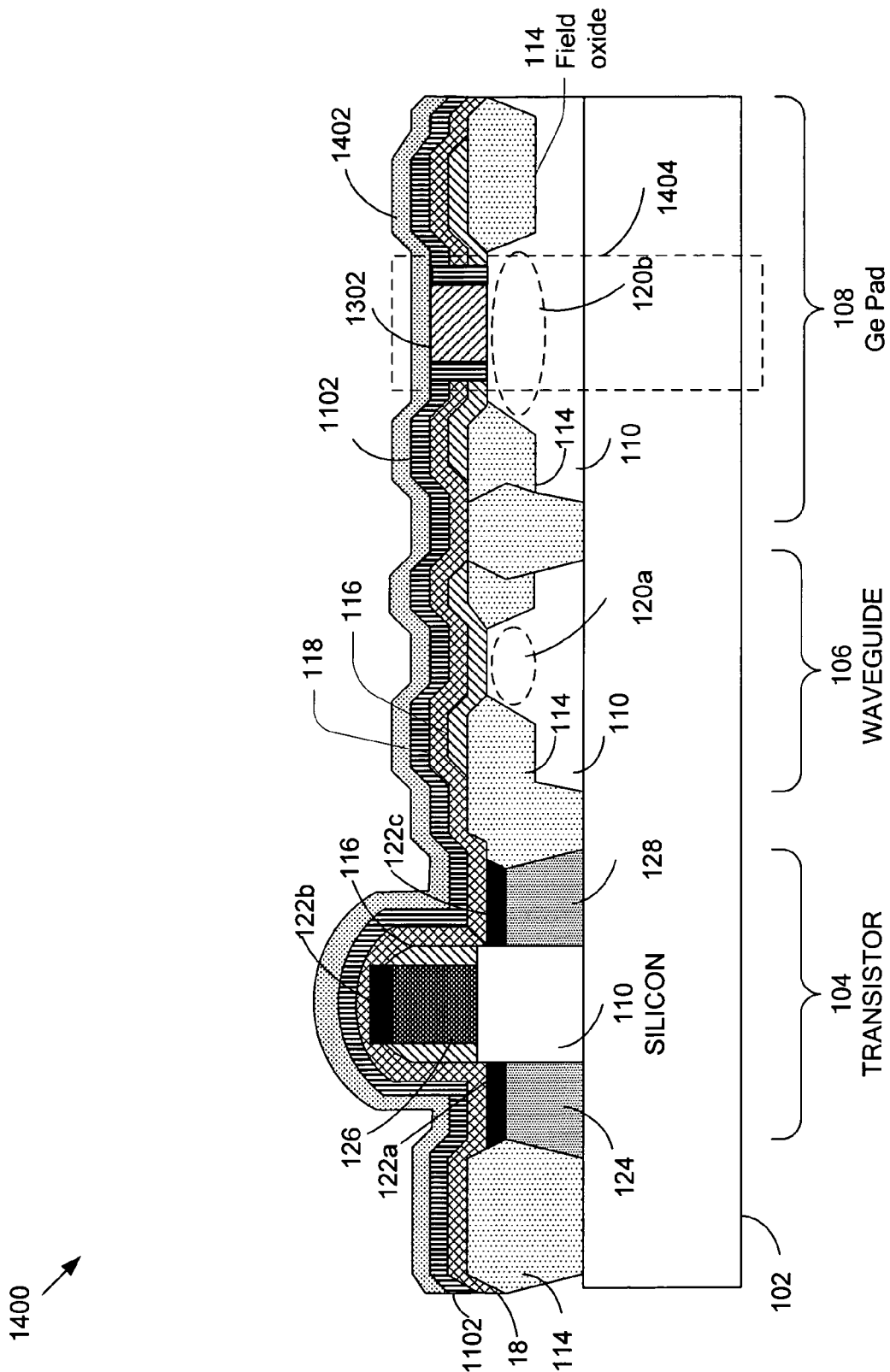
FIG. 14 is a schematic cross sectional diagram of a CMOS wafer fabricated by depositing a capping layer over the CMOS wafer in FIG. 13 in accordance with one embodiment of the present teachings.

After the silicon 110 is exposed, cleaning of the silicon surface may be performed, and then germanium growth may be accomplished, as shown in FIG. 13. FIG. 13 is a schematic cross sectional diagram of a CMOS wafer 1300 fabricated by growing a germanium (layer) 1302 over the CMOS wafer 1200 in accordance with one embodiment of the present teachings. The thickness of the Ge film may be equal to, less than, or thicker than the depth of the opening. The (germanium) capping layer 1402 may be then deposited over the CMOS wafer 1300 shown in FIG. 14. FIG. 14 is a schematic cross sectional diagram of a CMOS wafer 1400 fabricated by depositing a capping layer 1402 over the CMOS wafer 1300 in accordance with one embodiment of the present teachings. At this point, second process will be like the first process shown and processing will complete as previously described in FIGS. 8 and 9.

Figure 15:
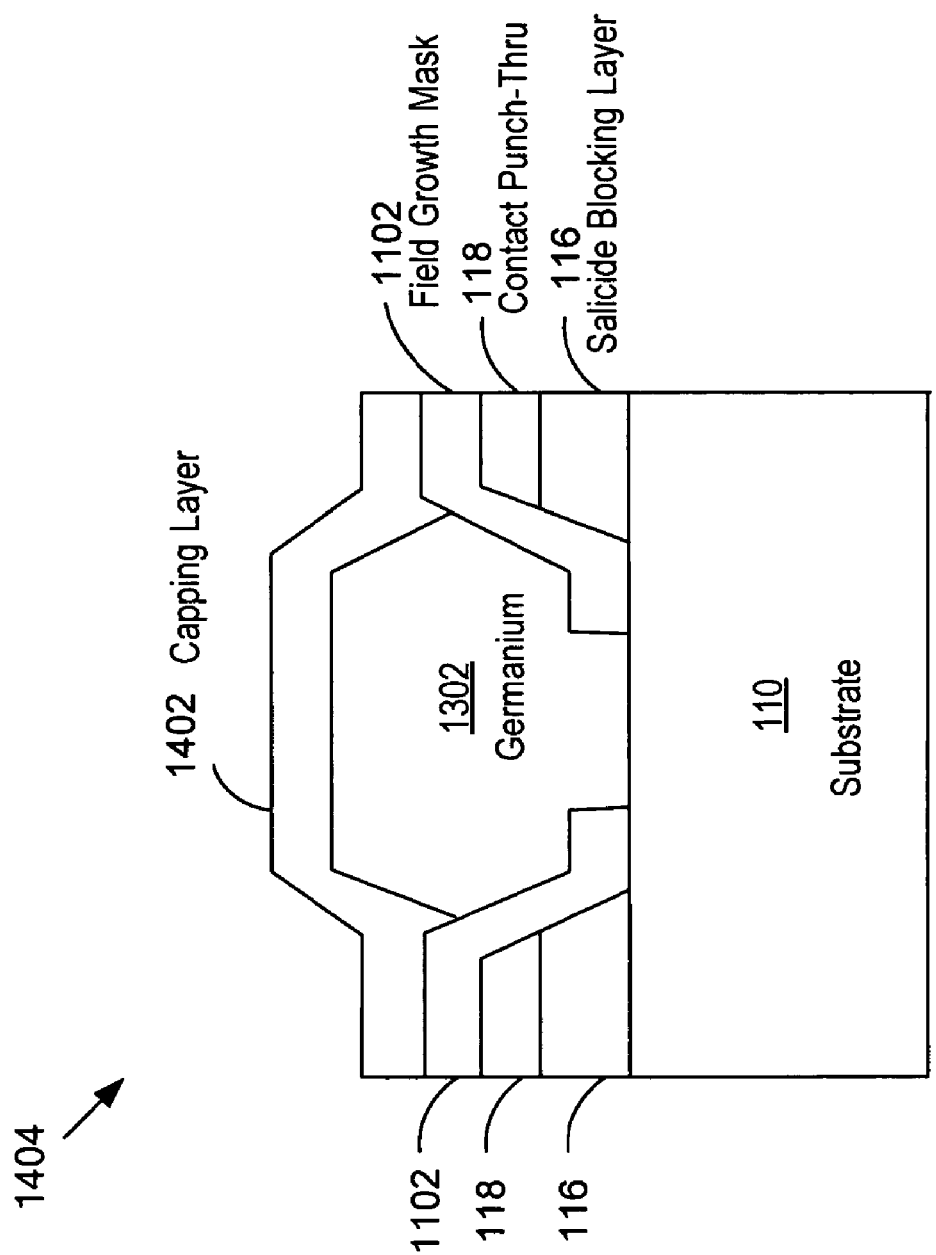
FIG. 15 is a close-up of a portion of the CMOS wafer in FIG. 14.

FIG. 15 shows a close-up of a portion 1404 of the CMOS wafer 1400 in FIG. 14. In FIG. 15, relative film thicknesses are not to scale, and the film geometries, such as sidewall angle and planarity are only representative, although are understood to vary considerably in different conditions. As can be noticed in FIG. 15, the field growth mask layer 1102 may extend over the contact punch through layer 118 preventing nucleation of unwanted germanium growth on the contact punch through layer 116. In case the first process has been used to generate the CMOS wafer 700, the cross section will look similar, except that the field mask will not be present on the sidewalls and bottom of the germanium 1302.

Figure 16:
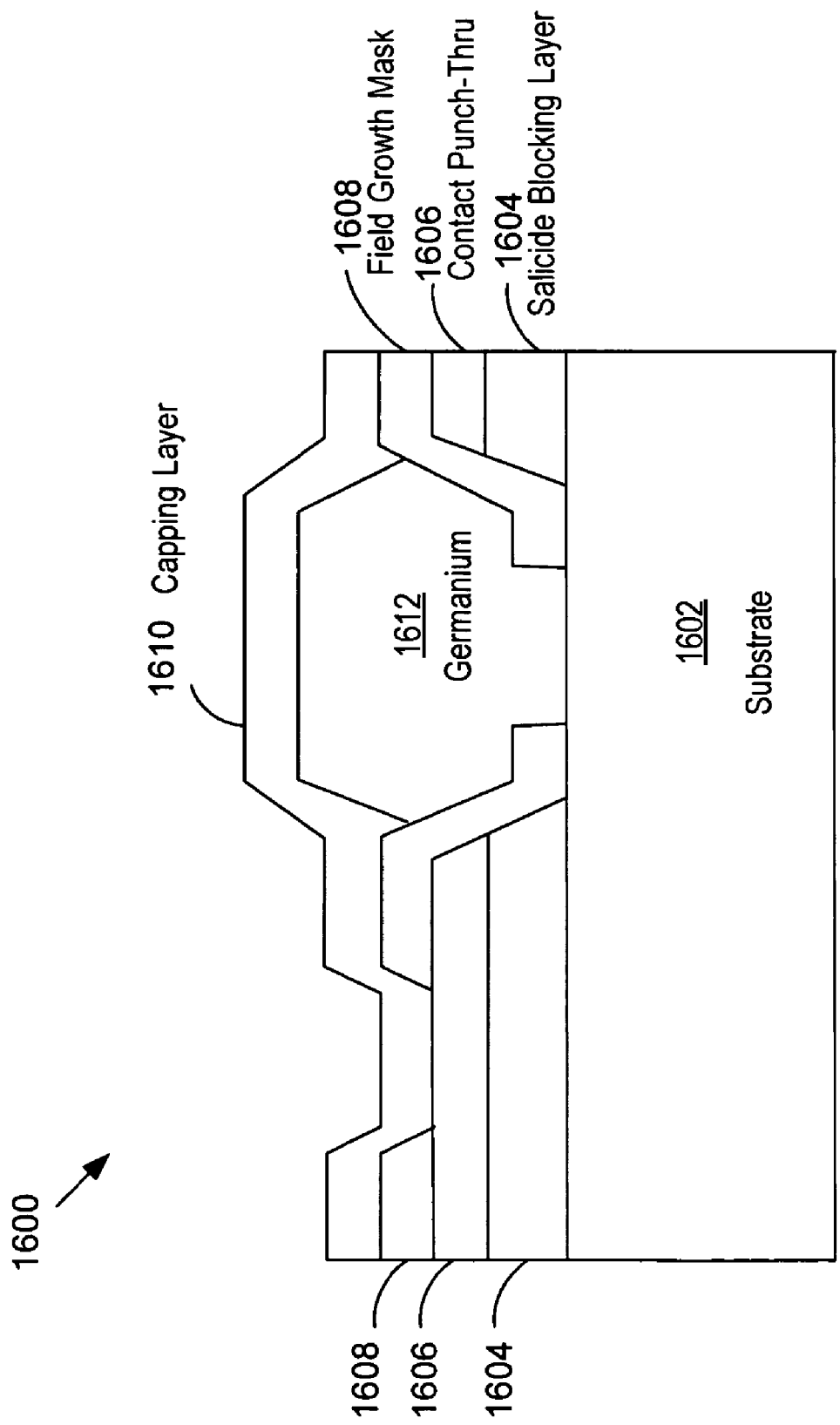
FIG. 16 is a close-up of a portion of a CMOS wafer that has a capping layer with a seal in accordance with one embodiment of the present teachings.

In the event that the presence of a contiguous layer of field masking material (202, 1102) is undesired underneath the germanium capping layer (502, 1402). An example reason for the need to eliminate the continuity of this film would be if it serves as a conduit for mobile ions that would impact device performance. In this case, an additional masking step could be added that patterns the field masking layer (202, 1102) at the point shown in FIG. 4 and FIG. 13. If the field masking layers 202 and 1102 are removed in a geometry that prints a continuous border around the germanium pad 108, then the subsequent deposition of the germanium capping layers 502 and 1402 will create intimate contact between the germanium capping layer 502 and 1402 and the contact punch layer 118, which will serve to break the diffusion path through the field masking layers 202 and 1102. FIG. 16 is a close-up of a portion 1600 of a CMOS wafer that has a capping layer with a seal in accordance with one embodiment of the present teachings. The layer structure of the portion 1600 is similar to that of the portion 1500 in FIG. 15 with a difference that a portion of the field growth mask layer 1608 has been removed to create the intimate contact (or, equivalently seal) between the capping layer 1610 with the contact punch through layer 1606.

The above embodiments are only illustrative of the principles of this invention and are not intended to limit the invention to the particular embodiments described. Accordingly, various modifications, adaptations, and combinations of various features of the described embodiments can be practiced without departing from the scope of the invention as set forth in the appended claims.

What is claimed is:

1. A method for incorporating germanium in a standard CMOS flow, comprising:
   providing a CMOS wafer comprising:
      a silicon-based substrate comprising a dielectric stack disposed on silicon wherein at least some portion of the dielectric stack serves as a mask and wherein the dielectric stack comprises two or more dielectric layers;

establishing one or more windows in the dielectric stack thereby exposing silicon;

establishing a germanium layer over the exposed silicon in the window; and, patterning and processing a capping layer over the CMOS wafer thereby removing at least some portion of the capping layer, and establishing at least one inter-level dielectric layer after the step of patterning and processing the capping layer.

2. The method of claim 1, further comprising the step of:
doping the germanium layer by performing one or more implants through the capping layer.

3. The method of claim 1, further comprising the step of:
planarizing at least one inter-level dielectric layer, thereby removing at least some portion of at least one inter-level dielectric layer and establishing a substantially flat surface.

4. The method of claim 1, further comprising the step of:
cleaning the exposed silicon before the step of establishing a germanium layer.

5. The method of claim 1, wherein the silicon-based substrate comprises a substrate selected from the list of:
a silicon-on-insulator (SOI) substrate, a silicon-on-sapphire (SOS) substrate, a silicon substrate and a silicon substrate comprising at least one silicon germanium (SiGe) layer.

6. The method of claim 1, wherein the germanium layer is selected from the list of: amorphous germanium, crystalline germanium, polycrystalline germanium and a stack comprising two or more germanium layers.

7. The method of claim 1, wherein the CMOS wafer comprises:
a transistor portion; and
a germanium pad portion and wherein the germanium pad portion comprises the germanium layer.

8. The method of claim 7, wherein the CMOS wafer further comprises:
a waveguide portion.

9. The method of claim 1 wherein one or more dielectric layers are graded in composition.

10. The method of claim 1 wherein the dielectric stack comprises two or more dielectric layers with different compositions.

11. The method of claim 1, wherein, at least one of the dielectric layers comprises silicon oxynitride ($Si_xO_yN_z$) layers wherein one of the composition parameters selected from the list of y and z, associated with the formula $Si_xO_yN_z$, is zero (0).

12. The method of claim 1, wherein at least one dielectric layer is selected from the list of: silicon rich oxynitride, silicon poor oxynitride, stoichiometric silicon oxide and stoichiometric silicon oxynitride.

13. The method of claim 1, wherein:
before the step of establishing a germanium layer, the dielectric layer disposed at the top of the dielectric stack is substantially stoichiometric silicon oxide.

14. The method of claim 1, wherein at least one dielectric layer serves as a field oxide layer.

15. The method of claim 1, wherein at least one dielectric layer serves as a salicide blocking layer.

16. The method of claim 15 wherein the salicide blocking layer comprises two or more layers.

17. The method of claim 15 wherein at least some portion of the salicide blocking layer enables ohmic contact to the silicon.

18. The method of claim 1, wherein at least one dielectric layer serves as a field growth mask layer.

19. The method of claim 18 wherein a thickness of the germanium layer is greater than a thickness of the field growth mask layer.

20. The method of claim 18, wherein the field growth mask layer comprises two or more layers.

21. The method of claim 18, wherein the field growth mask layer is highly selective to a germanium etching process.

22. The method of claim 18, further comprising the step of:
removing at least some portion of at least one dielectric layer by patterning and processing the field growth mask layer, before the step of depositing a germanium layer.

23. The method of claim 22, further comprising the step of:
removing at least some portion of at least one dielectric layer by patterning and processing the field growth mask layer, after the step of depositing a germanium layer.

24. The method of claim 22, further comprising the step of:
removing germanium material disposed on top of the field growth mask layer, thereby cleaning the top of the field growth mask layer.

25. The method of claim 1, wherein at least one dielectric layer serves as a contact punch through layer.

26. The method of claim 25 wherein the thickness of the contact punch through layer and the thickness of the capping layer are substantially the same.

27. The method of claim 25 wherein the composition of the contact punch through layer and the composition of the capping layer are substantially the same.

28. The method of claim 25 wherein, the thickness, composition and materials properties of the contact punch through layer and the thickness, composition and materials properties of the capping layer are selected such that, for a particular etching process, portions of the contact punch through layer and the capping layer may be etched away in substantially the same amount of time under substantially the same conditions.

29. The method of claim 25 further comprising the step of:
simultaneously removing the at least some portion of the contact punch through layer and at least some portion of the capping layer, thereby exposing at least one germanium region and at least one silicon region, and thereby enabling contact to a germanium region and a silicon region.

30. The method of claim 25 further comprising the step of:
patterning and processing the capping layer, thereby removing at least some portion of the capping layer; and,
establishing a dielectric layer over the CMOS wafer.

31. The method of claim 30 further comprising the steps of:
simultaneously removing at least some portion of the dielectric layer, contact punch through layer and capping layer, thereby generating a plurality of contact windows exposing silicon regions and germanium regions, wherein, the dielectric layer, contact punch through layer and capping layer are selected such that they may be removed in substantially the same amount of time;

depositing metal into the one or more contact windows to generate a first plurality of contacts to silicon regions and a second plurality of contacts to germanium regions; and depositing a routing metal layer.

32. The method of claim 30 wherein:

a transistor source is coupled to the routing metal layer by at least one transistor source contact selected from the set of: the first plurality of contacts and the second plurality of contacts;

a transistor drain is coupled to the routing metal layer by at least one transistor drain contact selected from the set of: the first plurality of contacts and the second plurality of contacts;

the thickness of the germanium layer is less than height of the transistor source contact; and, the thickness of the germanium layer is less than height of the transistor drain contact.

33. The method of claim 1, further comprising the step of:

doping the exposed silicon by performing one or more implants after the step of establishing one or more windows in the dielectric stack.

34. The method of claim 1, further comprising the step of:

establishing one or more dielectric layers after the step of establishing a germanium layer.

35. A method for integration of germanium into a CMOS wafer comprising the steps of:

providing a partially processed CMOS wafer comprising a silicon-based substrate with silicon transistor regions and a dielectric stack disposed over the partially processed CMOS wafer;

depositing a germanium growth masking layer comprising silicon dioxide on top of the dielectric stack;

establishing one or more germanium windows in the germanium growth masking layer and the dielectric stack, thereby exposing silicon;

executing a selective germanium deposition thereby depositing germanium in the germanium windows;

depositing a germanium capping film over the wafer wherein the germanium capping film is substantially identical to the dielectric stack in both composition and thickness;

removing at least some portion of the germanium capping film over at least some of the silicon transistor regions while preserving the portion of the germanium capping film disposed over the germanium, wherein the material remaining over at least some of the silicon transistor regions and the material over the germanium in the germanium windows are substantially the same in thickness and composition;

depositing spacing dielectric films over the partially processed CMOS wafer in preparation for a metallization layer;

simultaneously opening contact windows to both silicon transistor regions and germanium by removing some portions of the spacing dielectric film, the germanium capping film and the dielectric stack.

36. A method for integration of germanium into a CMOS wafer comprising the steps of:

providing a partially processed CMOS wafer comprising a silicon-based substrate with silicon transistor regions and a dielectric stack disposed over the partially processed CMOS wafer;

opening dielectric windows in the dielectric stack, thereby exposing silicon;

depositing a germanium growth masking layer comprising silicon dioxide on top of the dielectric stack;

establishing one or more germanium windows in the germanium growth masking layer wherein the germanium windows are enclosed by the dielectric windows, thereby exposing silicon and preserving germanium growth masking layer material on the sidewalls of the germanium window;

executing a selective germanium deposition thereby depositing germanium in the germanium windows;

depositing a germanium capping film over the wafer wherein the germanium capping film is substantially identical to the dielectric stack in both composition and thickness;

removing at least some portion of the germanium capping film over at least some of the silicon transistor regions while preserving the portion of the germanium capping film disposed over the germanium, wherein the material remaining over at least some of the silicon transistor regions and the material over the germanium in the germanium windows are substantially the same in thickness and composition;

depositing spacing dielectric films over the partially processed CMOS wafer in preparation for a metallization layer;

simultaneously opening contact windows to both silicon transistor regions and germanium by removing some portions of the spacing dielectric film, the germanium capping film and the dielectric stack.

37. A method for using a contact process to simultaneously make contact to both silicon and germanium films comprising providing a wafer with silicon transistor structures wherein the silicon transistor structures comprise ohmic contacts, said ohmic contacts covered with one or more dielectric films;

establishing germanium structures on the wafer displaced from the ohmic contacts;

establishing a capping layer over at least some portion of the germanium structures wherein the capping layer is substantially identical in composition and thickness to the one or more dielectric films disposed over the ohmic contacts;

simultaneously etching contact windows through the capping layer and the one or more dielectric films, thereby enabling contact to the ohmic contacts and the germanium structures in the same process.

\* \* \* \* \*